(12) United States Patent
Sparks et al.

(10) Patent No.: US 9,013,088 B1
(45) Date of Patent: Apr. 21, 2015

(54) FIELD EFFECT CONTROL OF A MICROELECTROMECHANICAL (MEMS) RESONATOR

(75) Inventors: Andrew Sparks, Cambridge, MA (US); Jan H. Kuypers, Cambridge, MA (US); Florian Thalmayr, Cambridge, MA (US)

(73) Assignee: Sand 9, Inc., Cambridge, MA (US)

( * ) Notice: Subject to any disclaimer, the term of this patent is extended or adjusted under 35 U.S.C. 154(b) by 257 days.

(21) Appl. No.: 13/542,200

(22) Filed: Jul. 5, 2012

Related U.S. Application Data

(60) Provisional application No. 61/505,445, filed on Jul. 7, 2011.

(51) Int. Cl.
H03H 9/05 (2006.01)
H03H 3/08 (2006.01)

(52) U.S. Cl.
CPC ..... *H03H 9/059* (2013.01); *H03H 3/08* (2013.01)

(58) Field of Classification Search
CPC .... H01L 41/053; H03H 9/02574; H03H 3/08; H03H 9/059; H03H 3/04
USPC ............................................. 310/313 R, 346
See application file for complete search history.

(56) References Cited

U.S. PATENT DOCUMENTS

| | | | |
|---|---|---|---|
| 5,592,010 A * | 1/1997 | Kakumu et al. | 257/368 |
| 6,972,510 B2 | 12/2005 | Klee et al. | |
| 7,586,239 B1 | 9/2009 | Li et al. | |
| 7,834,524 B2 * | 11/2010 | Wang et al. | 310/346 |
| 8,058,769 B2 * | 11/2011 | Chen et al. | 310/313 R |
| 8,362,675 B2 * | 1/2013 | Chen et al. | 310/346 |
| 8,742,854 B1 | 6/2014 | Lee et al. | |
| 2004/0021403 A1 | 2/2004 | Ayazi et al. | |
| 2004/0065940 A1 | 4/2004 | Ayazi et al. | |
| 2005/0241395 A1 | 11/2005 | Takahashi et al. | |
| 2006/0044078 A1 | 3/2006 | Ayazi et al. | |
| 2006/0125576 A1 | 6/2006 | Ho et al. | |
| 2008/0003770 A1 * | 1/2008 | Enomoto et al. | 438/411 |
| 2008/0186109 A1 | 8/2008 | Ho et al. | |
| 2008/0246559 A1 * | 10/2008 | Ayazi et al. | 333/187 |
| 2008/0297281 A1 | 12/2008 | Ayazi et al. | |
| 2010/0038991 A1 * | 2/2010 | Shih et al. | 310/313 B |
| 2010/0127596 A1 | 5/2010 | Ayazi et al. | |
| 2010/0127798 A1 | 5/2010 | Ayazi et al. | |
| 2010/0182102 A1 * | 7/2010 | Kuypers et al. | 333/197 |
| 2010/0244624 A1 | 9/2010 | Matsuda et al. | |

(Continued)

OTHER PUBLICATIONS

Samarao et al., "Intrinsic Temperature Compensation of Highly Resistive High-Q Silicon Microresonators via Charge Carrier Depletion," FCS—IEEE International Frequency Control Symposium 2010, pp. 334-339.

(Continued)

*Primary Examiner* — Derek Rosenau
*Assistant Examiner* — Bryan Gordon
(74) *Attorney, Agent, or Firm* — Wolf, Greenfield & Sacks, P.C.

(57) ABSTRACT

Apparatus and methods for control of charge in a semiconductor material of a mechanical resonating structure are described. Controlling the charge of the material may control the material properties of the semiconductor, such as the stiffness. Such control may result in changes in the behavior of the mechanical resonating structure, allowing for control and tuning of the behavior of the mechanical resonating structure.

13 Claims, 10 Drawing Sheets

(56) References Cited

U.S. PATENT DOCUMENTS

| | | |
|---|---|---|
| 2010/0308927 A1 | 12/2010 | Rebel et al. |
| 2010/0314969 A1 | 12/2010 | Bahreyni et al. |
| 2010/0319185 A1 | 12/2010 | Ayazi et al. |
| 2011/0050366 A1 | 3/2011 | Ayazi et al. |
| 2011/0240617 A1 | 10/2011 | Xu et al. |
| 2012/0074810 A1 | 3/2012 | Chen et al. |
| 2013/0021304 A1 | 1/2013 | Zuo et al. |
| 2013/0099629 A1 | 4/2013 | Ayazi et al. |

OTHER PUBLICATIONS

Keyes, R.W., "Electronic Effects in the Elastic Properties of Semiconductors," *Solid State Physics* 20:37-90 (1968).

Akiyama et al., Enhancement of Piezoelectric Response in Scandium Aluminum Nitride Alloy This Films Prepared by Dual Reactive Cospluttering. Adv Mater. 2009;21:593-6.

Jaakkola et al., Temperature compensated resonance modes of degenerately n-doped silicon MEMS resonators. Freq Control Symp. 2012 IEEE Intl. May 21-24, 2012;1-5.

Pensala et al., Bulk acoustic wave propagation characteristics in degenerately n-doped Si. Freq Control Symp. 2012 IEEE Intl. May 21-24, 2012;1-4.

Pensala et al., Temperature compensation of silicon MEMS Resonators by Heavy Doping. Ultrason Symp. 2011 IEEE Intl. Oct. 18-21, 2011;1952-5.

Samarao, Temperature compensation of silicon micromechanical resonators via degenerate doping. Electron Devices Meeting. 2009 IEEE Intl. Dec. 7-9, 2009;1-4.

\* cited by examiner

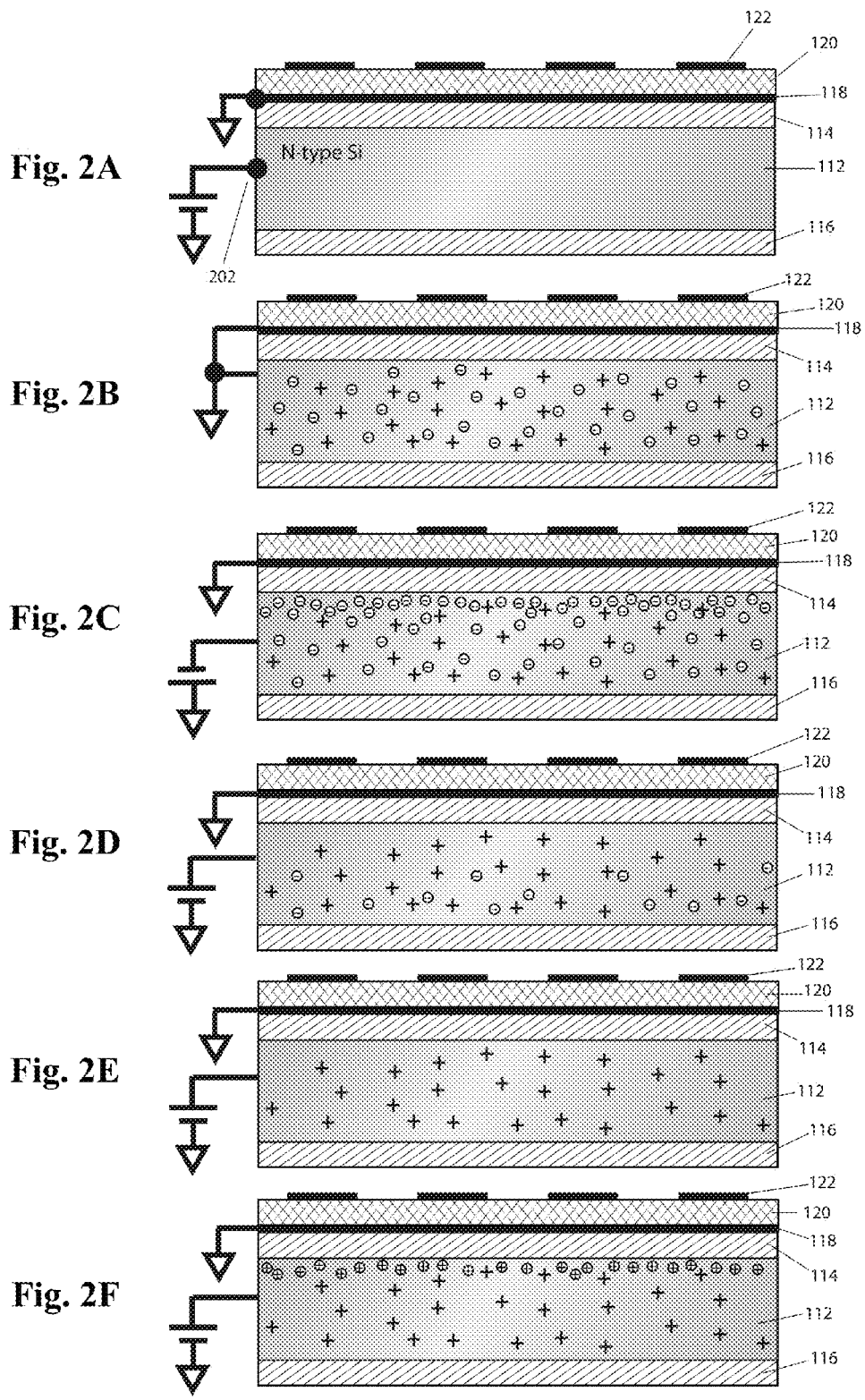

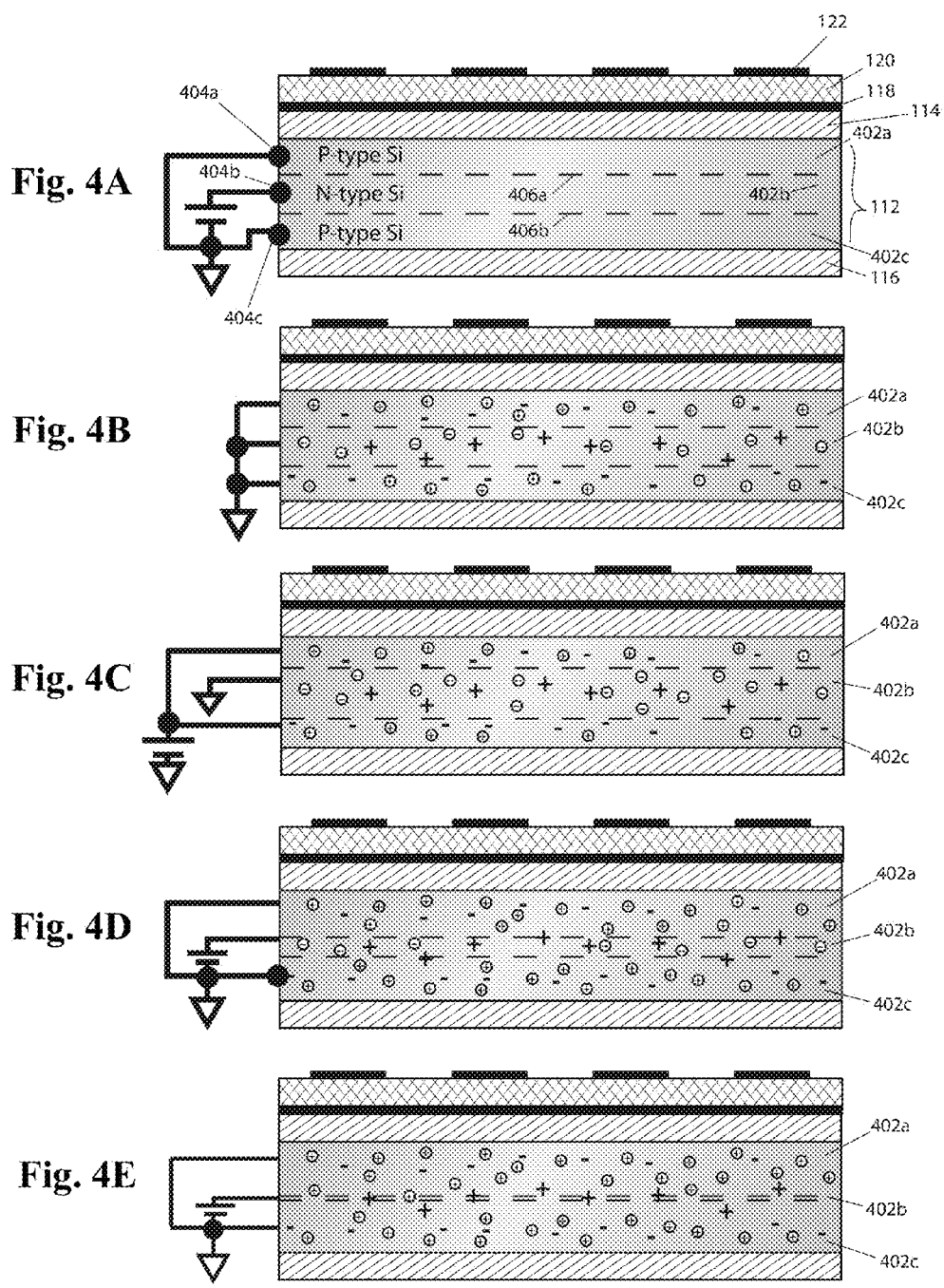

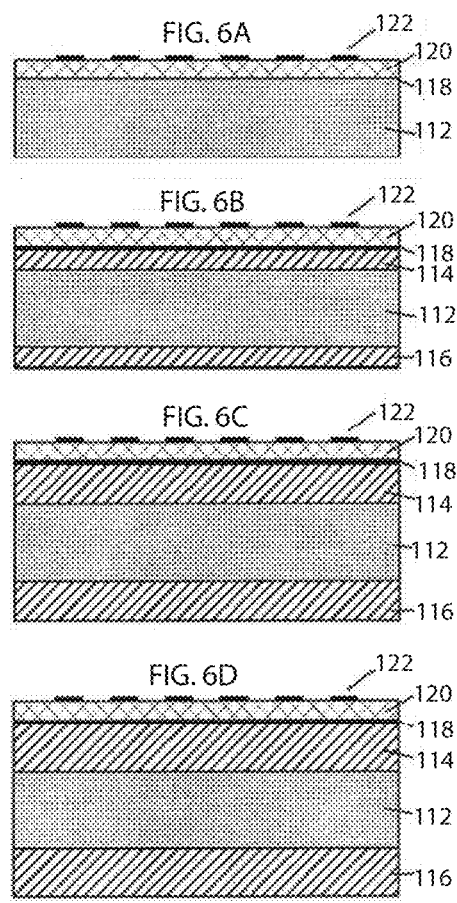

FIELD EFFECT CONTROL OF A MICROELECTROMECHANICAL (MEMS) RESONATOR

RELATED APPLICATIONS

This application claims the benefit under 35 U.S.C. §119 (e) of U.S. Provisional Application Ser. No. 61/505,445 filed on Jul. 7, 2011 and entitled "Field Effect Control Of A Microelectromechanical (MEMS) Resonator," the entire contents of which is incorporated herein by reference.

BACKGROUND

1. Field

The technology described herein relates to mechanical resonating structures, and related methods.

2. Related Art

Micromechanical resonators are small mechanical structures that are designed to vibrate at a desired resonance frequency and/or with a desired mode shape, and are used in oscillators, electromechanical filters, and inertial sensors, among other items. Resonators may be excited electrically to achieve desirable vibration amplitude. Additionally, their vibration may be detected and amplified electrically. Transduction may be achieved through electrostatic, piezoelectric, piezoresistive, thermal, electromagnetic, or other mechanisms. Often, drive and detection/sense functions are combined to allow the insertion of the resonator into an electrical circuit.

A common material used for the construction of microelectromechanical systems (MEMS) resonators is silicon. Single crystal silicon, in particular, has many advantages, including high material quality factor, inherent stability of the material, the existence of specialized manufacturing processes, and low cost.

SUMMARY

According to a first aspect, a piezoelectric mechanical resonating structure is provided. The piezoelectric mechanical resonating structure comprises a first electrode, a second electrode, and a piezoelectric material active layer between the first and second electrodes and configured to oscillate in response to application of an electric voltage thereto by the first and second electrodes. The piezoelectric mechanical resonating structure further comprises a semiconductor layer, wherein the second electrode is configured between the semiconductor layer and the piezoelectric material active layer, and wherein the semiconductor layer is a suspended layer coupled to a substrate by at least one anchor. The piezoelectric mechanical resonating structure further comprises an electrical contact to the semiconductor layer and distinct from the second electrode. The second electrode and the electrical contact to the semiconductor layer are configured to apply a bias voltage to the semiconductor layer.

According to another aspect, a mechanical resonating structure is provided, comprising an active layer configured to oscillate in response to actuation, a support layer comprising a semiconductor material and configured to support the active layer, and a plurality of electrodes configured to apply a bias voltage to the support layer to control a charge distribution of the support layer.

According to another aspect, a method of operating a mechanical resonating structure having an active layer and a semiconductor support layer is provided. The method comprises applying a bias voltage to the semiconductor support layer to control a charge distribution within the semiconductor support layer.

According to another aspect, a device is provided, comprising a substrate and a mechanical resonating structure coupled to the substrate. The mechanical resonating structure comprises an active layer configured to resonate in response to actuation, and a support layer comprising a semiconductor material and configured to support the active layer. One or more components of the device are configured to apply a bias voltage to the semiconductor layer to control a charge distribution of the semiconductor layer.

BRIEF DESCRIPTION OF THE DRAWINGS

Various aspects and embodiments of the technology will be described with reference to the following figures. It should be appreciated that the figures are not necessarily drawn to scale. Items appearing in multiple figures are indicated by the same or similar reference number in all the figures in which they appear.

FIGS. 2A-2F illustrate a mechanical resonating structure having a conducting layer, an oxide layer, and a semiconductor layer configured as a capacitor to control charge carrier distribution in the semiconductor layer, according to a first non-limiting embodiment.

FIGS. 4A-4E illustrate a mechanical resonating structure having a semiconductor layer doped to form three distinct doping regions therein to control charge carrier distribution in the semiconductor layer, according to a third non-limiting embodiment.

FIG. 6A shows a diagram of a mechanical resonating structure with a negatively-sloped temperature coefficient of frequency.

FIG. 6B shows a diagram of a mechanical resonating structure including a temperature compensation structure and having a negatively-sloped temperature coefficient of frequency.

FIG. 6C shows a diagram of a mechanical resonating structure including a temperature compensation structure and having an approximately zero temperature coefficient of frequency.

FIG. 6D shows a diagram of a mechanical resonating structure including a temperature compensation structure and having a positively-sloped temperature coefficient of frequency.

DETAILED DESCRIPTION

Figure 1A:
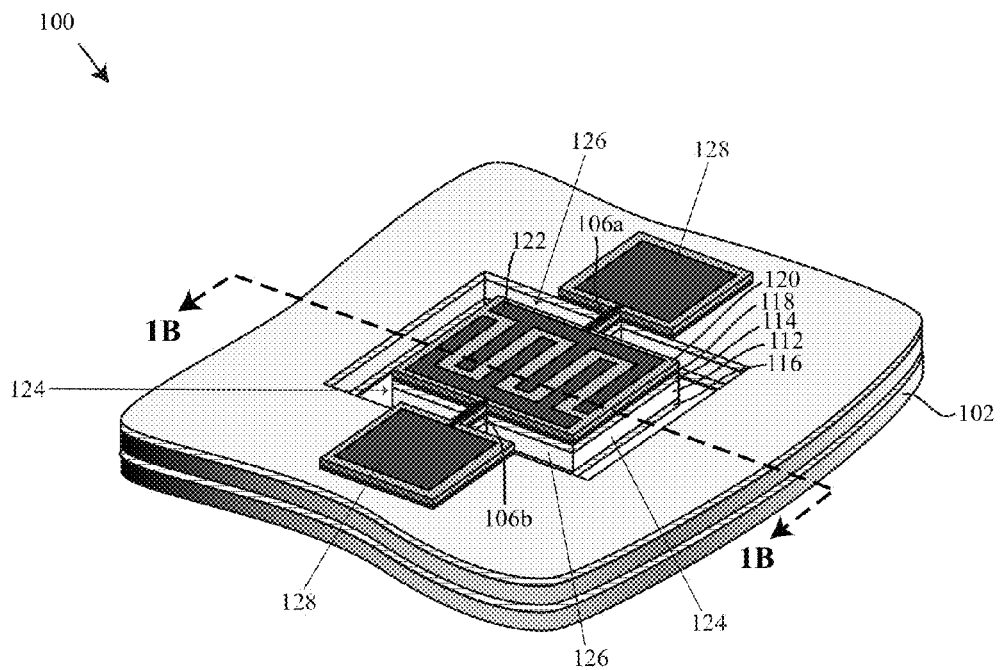
FIGS. 1A and 1B illustrate a perspective view and a cross-sectional view, respectively, of a resonating structure as may be used according to various aspects described herein.

Applicants have appreciated that, because the charge distribution in a semiconductor material can influence the properties of such a material, such as the stiffness of the semiconductor material, the behavior of a mechanical resonator configured to resonate (or oscillate) including a semiconductor material may be controlled by controlling the charge distribution in the semiconductor, for example with an applied electric field. Thus, various aspects of the present application relate to apparatus and methods for controlling the charge distribution in a semiconductor material of a mechanical resonating structure by way of an applied voltage/electric field.

According to a first aspect of the application, a piezoelectric mechanical resonating structure is provided that includes an active layer comprising a piezoelectric material, a semiconductor layer, an electrical contact to the semiconductor layer, and multiple electrodes. The electrical contact and at least one of the electrodes may be configured to apply a voltage to the support layer to control (and in some instances, alter) the charge carrier distribution therein, and therefore to tune (or control) the mechanical properties of the semiconductor layer. Accordingly, the oscillation or resonance of the mechanical resonating structure may be tuned (or controlled).

The semiconductor layer may serve as a support structure for the active layer, may be part of a temperature compensation stack structure of the mechanical resonating structure, or may serve any other suitable purpose. The electrical contact may be made in any suitable manner and to any suitable part of the semiconductor layer. For example, according to a non-limiting embodiment, direct electrical contact may be made to the semiconductor layer (e.g., to a top surface of the semiconductor layer as a non-limiting embodiment), and charge may be injected into and/or removed from the semiconductor layer via the direct electrical contact. At least some of the electrodes may be configured to apply an actuation signal to the active layer.

According to another aspect of the present application, a mechanical resonating structure is provided comprising an active layer configured to oscillate in response to actuation, a support layer comprising a semiconductor material and configured to support the active layer, and a plurality of electrodes configured to apply a bias voltage to the semiconductor layer to control a charge distribution of the semiconductor layer. In some non-limiting embodiments, the semiconductor layer may form part of a capacitor, a diode, a transistor, or any other suitable electrical component. In some non-limiting embodiments, one or more of the electrodes may make direct electrical contact to the semiconductor layer.

According to another aspect of the present application, a method of operating a mechanical resonating structure having an active layer and a semiconductor support layer is provided. A bias voltage may be applied to the semiconductor layer in any suitable manner to control the distribution of charge carriers in the semiconductor layer, thereby controlling the mechanical properties (such as stiffness) of the semiconductor layer. The bias voltage may be constant or may vary over time (e.g., such as an alternating current (AC) signal), for example in response to certain events or conditions, or in a predetermined time varying manner (e.g., in a sinusoidal manner).

The aspects described above, as well as additional aspects, are described further below. These aspects may be used individually, all together, or in any combination of two or more, as the technology is not limited in this respect.

Figure 1B:
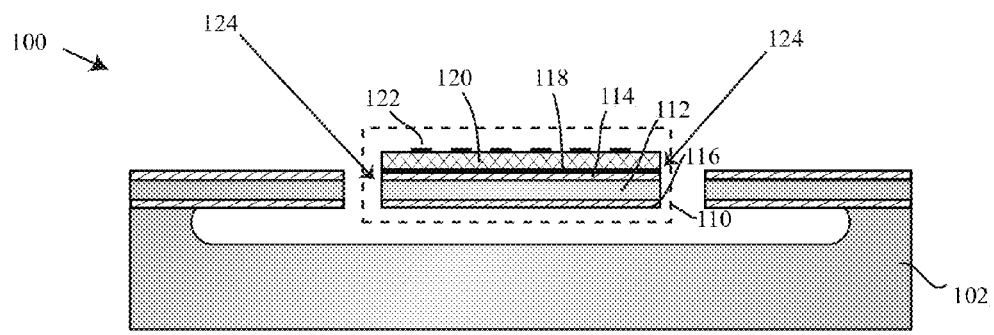

A non-limiting example of a mechanical resonating structure to which aspects of the present application may apply is illustrated in FIGS. 1A and 1B and now described. However, it should be appreciated that the various aspects are not limited to the type of mechanical resonating structures shown herein, but rather that other types of mechanical resonating structures having semiconductor materials may be used.

FIGS. 1A and 1B provide a perspective view and a more detailed cross-sectional view, respectively, of a device 100 including a micromechanical resonating structure 110 (reference number shown in FIG. 1B). As illustrated, the micromechanical resonating structure 110 may include an active layer 120 (e.g., a piezoelectric layer, for example made of aluminum nitride, or any other suitable piezoelectric material), a conducting layer 118 (e.g., a metal electrode), and one or more electrodes 122 (which may, in some embodiments, be configured as top electrodes). A contact pad 128 may provide electrical access to the electrodes 122. The conducting layer 118 may, in some embodiments, be configured as an electrode, and may therefore in some embodiments be considered a bottom electrode. Electrical access to the conducting layer may be provided by a portion of the conducting layer located below the contact pad 128. For example, the portion of the conducting layer located below the contact pad 128 may be made larger than the contact pad 128, allowing for separate electrical contact to be made to the contact pad 128 and the portion of the conducting layer 118 located below the contact pad. Alternatively, a separate contact pad (e.g., next to contact pad 128 or in any other suitable location), may provide electrical access to the conducting layer 118. Other alternatives are also possible. The active layer 120 may be actuated by applying a voltage/electric field thereto using electrodes 122 (formed, for example, of a metal) and bottom conducting layer 118, which in some embodiments may be configured as a ground plane. Not all the illustrated components are required and other components may be included in some embodiments, as the illustration provides a non-limiting example of a mechanical resonating structure.

The micromechanical resonating structure 110 also includes a silicon layer 112, a silicon oxide layer 114 on the top surface of the silicon layer 112, and a silicon oxide layer 116 on the bottom surface of the silicon layer 112. The combination of silicon layer 112 and silicon oxide layers 114 and 116 may operate as a temperature compensation structure (a temperature compensation stack in this configuration) to compensate temperature-induced changes in the frequency of operation of micromechanical resonating structure 110, as described further below. It should be appreciated that the silicon layer 112 may be formed of any suitable semiconductor material, and that silicon is a non-limiting example described herein for purposes of illustration. Non-limiting alternatives include germanium, gallium arsenide, or other semiconductor materials. Thus, the use of silicon for layer 112 is not limiting. Similarly, layers 114 and 116 may be formed of any suitable material (e.g., other types of oxide than silicon oxide), as silicon oxide is a non-limiting example described herein for purposes of illustration. Also, as mentioned, not all the illustrated components are required and other components may be included in some embodiments, as the illustration provides a non-limiting example of a mechanical resonating structure.

The micromechanical resonating structure may be connected to a substrate 102 by two or more anchors. As shown in FIG. 1A, the micromechanical resonating structure 110 is connected to the substrate 102 by two anchors, 106a and 106b, which may be flexible in some embodiments. The number of anchors is not limiting, as any suitable number may be used. It should further be understood that the geometry of the anchors may be matched to a specific length to reduce the amount of acoustic energy transferred from the micromechanical resonating structure to the substrate. Suitable anchor structures that reduce stress and inhibit energy loss have been described in U.S. patent application Ser. No. 12/732,575, filed Mar. 26, 2010, published as U.S. Patent Publication No. 2010/0314969 and entitled "Mechanical Resonating Structures and Methods", which is hereby incorporated herein by reference in its entirety.

As mentioned, various types and forms of mechanical resonating structures may be used with the aspects of the present application, and FIGS. 1A and 1B provide only a non-limiting example. For example, the mechanical resonating structure may comprise or be formed of any suitable material(s) and may have any composition. According to some embodiments, the mechanical resonating structure may comprise a piezoelectric material (e.g., active layer 120). According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonating structure comprises a piezoelectric material, the piezoelectric material may be single crystal material, although in other embodiments including a piezoelectric material the piezoelectric material may be polycrystalline.

The mechanical resonating structure may have any shape, as the shape illustrated in FIGS. 1A and 1B is a non-limiting example. For example, aspects of the technology may apply to mechanical resonating structures that are substantially rectangular, substantially ring-shaped, substantially disc-shaped, or that have any other suitable shape. As additional, non-limiting examples, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Moreover, the mechanical resonating structure may have one or more beveled edges. According to some embodiments, the mechanical resonating structure may be substantially planar. Moreover, geometrical and structural alterations can be made to improve quality (e.g., Q-factor, noise) of a signal generated by the mechanical resonating structure.

The mechanical resonating structures described herein may have any suitable dimensions, and in some embodiments may be micromechanical resonating structures. A mechanical resonating structure may have any suitable thickness, T, and in some embodiments the thickness may be related to a wavelength of a desired oscillation mode. According to a non-limiting embodiment, the thickness T may be less than $2\lambda$, less than $\lambda$, less than $\frac{1}{2}\lambda$, less than $\frac{1}{4}\lambda$, less than $\frac{1}{6}\lambda$, or any other suitable value, where $\lambda$ is a wavelength of operation of the mechanical resonating structure (e.g., a wavelength of a resonance mode of interest of a mechanical resonating structure, an acoustic wavelength of a Lamb wave of interest, etc.). According to a non-limiting embodiment, the mechanical resonating structure may be configured to support Lamb waves, and T may be less than $2\lambda$, less than $\frac{1}{2}\lambda$, or have any other suitable According to some embodiments, the mechanical resonating structures described herein have a large dimension (e.g., the largest of length, width, diameter, circumference, etc. of the mechanical resonating structure) of less than approximately 1000 microns, less than approximately 100 microns, less than approximately 50 microns, or any other suitable value. It should be appreciated that other sizes are also possible. According to some embodiments, the devices described herein form part or all of a microelectromechanical system (MEMS).

The mechanical resonating structures may have any desired resonance frequencies and frequencies of operation, and may be configured to provide output signals of any desired frequencies. For example, the resonance frequencies and/or frequencies of operation of the mechanical resonating structures, and the frequencies of the output signals provided by the mechanical resonating structures, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the listed frequencies are not limiting.

The mechanical resonating structures may be operated in various acoustic modes, including but not limited to Lamb waves, also referred to as plate waves including flexural modes, bulk acoustic waves, surface acoustic waves, extensional modes, translational modes and torsional modes. The selected mode may depend on a desired application of the mechanical resonating structure.

The mechanical resonating structure may be actuated and/or detected in any suitable manner, with the particular type of actuation and/or detection depending on the type of mechanical resonating structure, the desired operating characteristics (e.g., desired mode of operation, frequency of operation, etc.), or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators. Such Lamb wave devices may operate based on propagating acoustic waves, with the edges of the structure serving as reflectors for the waves. For such devices, the spacing between the edges of the resonating structure may define the resonance cavity, and resonance may be achieved when the cavity is an integer multiple of p, where $p=\lambda/2$, with $\lambda$ being the acoustic wavelength of the Lamb wave of interest, understanding that the device may support more than one mode of Lamb waves. However, it should be appreciated that aspects of the technology described herein apply to other types of structures as well, and that Lamb wave structures are merely non-limiting examples.

As should be appreciated from FIGS. 1A and 1B, in some embodiments suspended mechanical resonating structures are used, meaning that the mechanical resonating structure(s) may have one or more free sides. Referring to FIG. 1A, the micromechanical resonating structure 110 has free ends 124 and the sides 126 are also substantially free, connected to the substrate 102 by anchors 106a and 106b.

As mentioned, according to an aspect of the present application, the charge carrier distribution within a semiconductor layer of a mechanical resonating structure may be controlled by application of an electric field (e.g., from a bias voltage). Referring to the non-limiting example of micromechanical resonating structure 110, the charge carrier distribution within silicon layer 112 may be controlled by application of a bias voltage to the silicon layer 112. Several configurations for applying such a bias voltage are possible, depending on the location and type of proximal electrode used. Three non-limiting embodiments of suitable configurations include: 1) a dielectrically isolated electrode, similar to a MOS capacitor; 2) an electrode in direct contact with the silicon, as employed in a Schottky diode; and 3) locally defined doped regions at the top and/or bottom of the silicon, similar to a junction field-effect transistor (JFET) or a pn junction diode. In each of these non-limiting embodiments, the intent is not to encourage current flow through the structure, but to control the spatial distribution of charge concentration in the semiconductor material.

The three above-described configurations for controlling the charge concentration in a semiconductor layer of a mechanical resonating structure are now described in turn. For purposes of explanation, all embodiments are illustrated using n-type silicon, which is doped with phosphorous or any other suitable element to result in more electrons (negative charge carriers) than holes (positive charge carriers) in the silicon layer. The doping level may be selected to allow for suitable subsequent control of the charge carrier distribution according to the techniques described herein. As a non-limiting example, the doping level may be intermediate (e.g., on the order of $10^{15}$-$10^{18}$ dopants/cm$^3$, though other doping ranges are also possible). High doping levels may impact the stiffness of the material more, but lower doping levels have the benefit that an applied electric field may penetrate further into the semiconductor material. Thus, intermediate doping levels may represent a suitable compromise. However, the various aspects are not limited to using any particular initial doping concentration of a semiconductor material. As mentioned previously, silicon is a non-limiting example of a semiconductor of interest, as other semiconductor materials (e.g., germanium, gallium arsenide, or other semiconductor materials) may be used additionally or alternatively. Furthermore, p-type silicon (or another semiconductor material) may alternatively be used. If such p-type silicon is used (e.g., doped with boron or another suitable element), holes become the dominant charge carrier. The results described below for use of n-type silicon also apply to p-type silicon, but with the sign of all charges and the quoted polarities of DC voltages inverted.

MOS Capacitor

FIGS. 2A-2F illustrate an embodiment in which a mechanical resonating structure may be controlled by applying a bias voltage to a semiconductor layer of the mechanical resonating structure to control charge carrier distribution within the semiconductor layer. In the configuration of FIGS. 2A-2F, the structure (e.g., conducting layer 118, silicon oxide layer 114 and silicon layer 112) behaves like a metal oxide semiconductor (MOS) capacitor, as will be described further below. FIGS. 2A-2F utilize the micromechanical resonating structure 110 of FIGS. 1A-1B, and thus the individual elements are not described in detail again now. However, it should be appreciated that the various aspects of the present application are not limited to use with a micromechanical resonating structure of the type of micromechanical resonating structure 110, but rather may apply to other resonating structures as well.

In the embodiment of FIGS. 2A-2F, the temperature compensation stack formed by silicon layer 112 and silicon oxide layers 114 and 116 supports a piezoelectric stack featuring the active layer 120 (e.g., a piezoelectric thin film, of any suitable material) sandwiched between conducting layer 118 and electrodes 122. Conducting layer 118 of the piezoelectric stack may be grounded and may effectively provide a separate electrode (separate from electrodes 122) close to the silicon layer 112 that can be used to achieve field effect control, as now described.

FIGS. 2A-2F illustrate various configurations of the charge carriers within the silicon layer 112 for different applied direct current (DC) bias voltages. As shown in FIG. 2A, the conducting layer 118 may be connected to ground, though other options for setting the electric potential of conducting layer 118 are also possible. Referring to FIG. 1A, electrical contact to the conducting layer may be made as previously described with respect to FIG. 1A (e.g., via a contact pad), or in any other suitable manner, as the various aspects of the present application are not limited in this respect.

Figure 9:
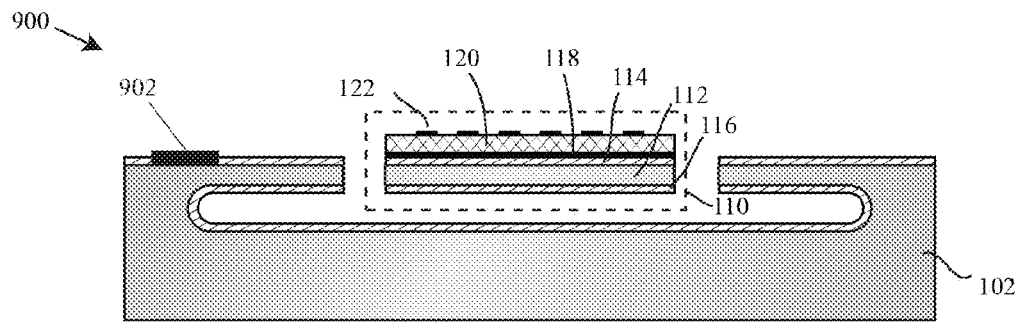
FIG. 9 illustrates a non-limiting example of a manner of making electrical contact to a semiconductor material of a mechanical resonating structure, according an embodiment of the present application.

An electrical contact 202 is provided to the silicon layer 112. The electrical contact may include an electrode or any other suitable element for applying a voltage to the silicon layer 112. The electrical contact 202 may be a direct electrical contact in at least some embodiments, allowing for injection of charge into the silicon layer 112 and/or removal of charge from the silicon layer 112. A non-limiting example of a manner of making such direct electrical contact is shown in FIG. 9. As shown, an electrical contact 902 (which may correspond to electrical contact 202) is made to the silicon of substrate 102, for example by etching a hole into the silicon oxide layer 114 and forming the electrical contact 902 (of metal, or any other suitable electrically conductive contact material). Because the silicon layer 112 of the substrate is formed from, and connected to, the silicon of the substrate 102 in this non-limiting embodiment (see, e.g., FIG. 1A illustrating that the silicon layer 112 extends across the anchors 106a and 106b to the substrate 102), making direct electrical contact to the silicon using electrical contact 902 as shown in FIG. 9 provides direct electrical contact to the silicon layer 112.

The electrical contact to the silicon layer 112 may be made at any suitable location. For example, as shown in FIG. 9, the electrical contact 902 may contact an upper (or top) surface of the silicon layer 112. Alternatively, electrical contact may be made to a side surface of the silicon layer 112, or to a bottom surface, as the various aspects described herein are not limited in this respect.

FIG. 2A illustrates the configuration of a mechanical resonating structure according to an aspect of the present application, but does not illustrate the charge distribution.

In FIG. 2B, the silicon layer 112 and conducting layer 118 are shorted (i.e., short circuited) together, and the intrinsic distribution of charges within the silicon layer 112 is shown. The free electrons (negative and circled) are mobile, while the dopant sites (positive and not circled) are fixed. The net charge in the silicon layer is zero, and with no applied driving force (i.e., no applied voltage), the electrons are uniformly distributed throughout the silicon.

In FIG. 2C, referred to as the "accumulation" regime, a negative DC bias is applied to silicon layer 112 using suitable voltages applied to the silicon layer 112 and the conducting layer 118, which attracts electrons in the silicon layer 112 to the interface of the silicon layer 112 with the silicon oxide layer 114. Away from the oxide layer 114, the concentration of electrons equals its initial concentration. Thus, both the stiffness tensor of the silicon layer 112 and its contribution to the temperature coefficients of frequency (TCF) of the mechanical resonating structure vary from top to bottom of the silicon layer 112. The magnitude of this variation increases as a more negative DC voltage is applied to the silicon layer 112 since more electrons accumulate at the interface of the silicon layer 112 with the silicon oxide layer 114.

The variation through the thickness of the silicon layer 112 may be thought of as effectively creating distinct "sublayers" within the silicon layer 112. For example, a first sublayer proximate the interface between the silicon layer 112 and the silicon oxide layer 114 may exhibit a first type stiffness and TCF, while a second sublayer of the silicon layer 112 distal the interface between the silicon layer 112 and the silicon oxide layer 114 may exhibit a second type of stiffness and TCF. In one non-limiting embodiment, control of the charge carrier concentration in the silicon layer 112 may result in a first sublayer of the silicon layer 112 exhibiting a positive TCF and a second sublayer exhibiting a negative TCF, though not all embodiments are limited in this respect.

In FIG. 2D, referred to as the "depletion" regime, a small positive DC voltage is applied to the silicon layer 112 and electrons are driven away from the interface between the silicon layer 112 and the silicon oxide layer 114 (and ultimately into the voltage source). The electron concentration at the interface between the silicon layer 112 and the silicon oxide layer 114 is lower than its native concentration, resulting in a variation of the stiffness tensor of the silicon layer 112 from top to bottom of the silicon layer 112. Increasing the voltage further, as in FIG. 2E, may eventually deplete the entire silicon layer 112, resulting in a nearly uniform stiffness tensor that is, for example, up to several percent (e.g., up to approximately 5%, up to approximately 10%, between approximately 2-8%, between approximately 5-10%, or any other suitable percentage) different from the intrinsic stiffness tensor.

With even greater positive DC voltages (e.g., see FIG. 2F), the silicon layer 112 is so depleted of electrons that holes (positive and circled) become the dominant charge carrier and migrate to the interface of silicon layer 112 with silicon oxide layer 114. This mode is called "inversion" because the polarity of dominant charge carriers changes. Again, the stiffness tensor varies through the thickness of the silicon layer 112.

Though the embodiment of FIGS. 2A-2F is not limited to any particular voltages being applied, non-limiting examples include between 1-10 Volts (e.g., 3 Volts, 5 Volts, etc.), between 10-20 Volts, between 1-25 Volts, or any other suitable voltages. The voltage applied to achieve a desired charge carrier concentration may depend on the types of semiconductor material, thicknesses of any semiconductor and oxide layers, and the doping level of the semiconductor material, among other things.

Figure 10:
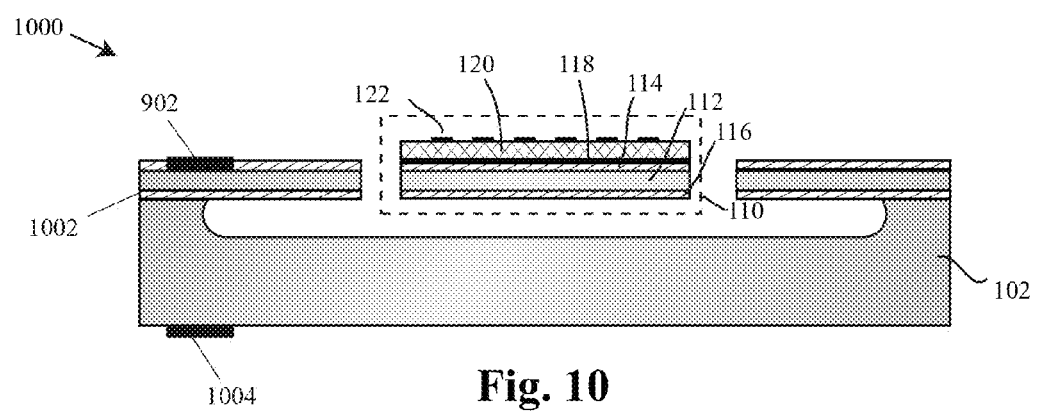
FIG. 10 illustrates an alternative configuration to that of FIGS. 2A-2F for applying a bias voltage to a semiconductor layer of a mechanical resonating structure, according to an embodiment of the present application.
Figure 11:
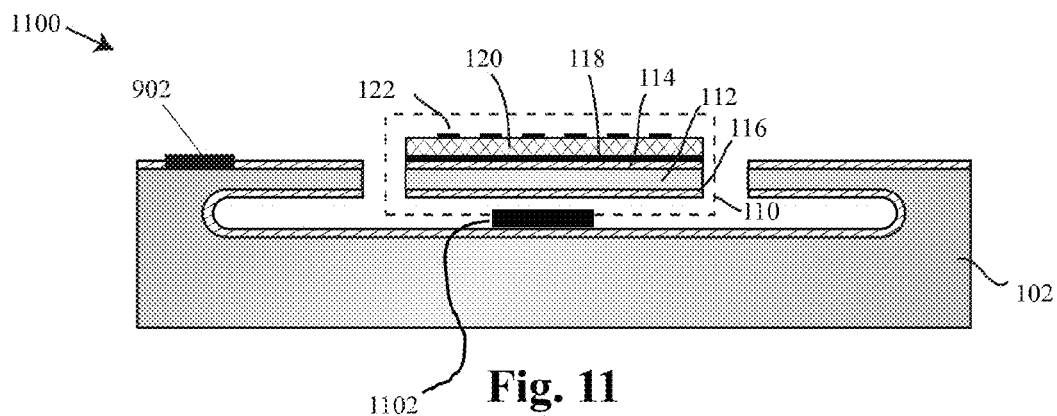
FIG. 11 illustrates an additional alternative configuration to that of FIGS. 2A-2F for applying a bias voltage to a semiconductor layer of a mechanical resonating structure, according to an embodiment of the present application.

FIGS. 2A-2F and 9 illustrate a non-limiting configuration in which a bias voltage may be applied to a semiconductor layer of a mechanical resonating structure. As explained, in the configuration of those figures the bias voltage may be applied using a combination of conducting layer 118 and electrical contact 202. Alternatives are possible, for example in which a bias voltage may be applied to a semiconductor layer of a mechanical resonating structure without using the conducting layer 118. FIGS. 10 and 11 illustrate two such alternatives, though others are possible.

As shown in FIG. 10 the device 1000 may differ from the device 100 of FIG. 1B in that the silicon layer 112 may not be electrically connected to the bulk silicon of substrate 102. Rather, in the non-limiting example shown, a non electrically conductive layer (e.g., an oxide layer, such as silicon oxide or any other suitable material) may separate the silicon layer 112 from the bulk silicon of substrate 102. For purposes of illustration, an oxide layer 1002 is shown as separating the silicon layer 112 from the bulk silicon of the substrate 102. An electrical contact 1004 may be made to the substrate 102 in any suitable manner.

According to the non-limiting embodiment of FIG. 10, a bias voltage may be applied to the silicon layer 112 using the electrical contacts 902 and 1004, irrespective of any voltage applied to conducting layer 118. The device 1000 may be operated to exhibit similar behavior to that shown in FIGS. 2A-2F by application of suitable voltages to the electrical contacts 902 and 1004.

FIG. 11 illustrates a further non-limiting alternative. As shown, the device 1100 may include an electrode 1102 disposed beneath the micromechanical resonating structure 110. Application of suitable voltages to the electrode 1102 and electrical contact 902 may provide similar behavior of the silicon layer 112 to that shown in FIGS. 2A-2F, irrespective of any voltage applied to the conducting layer 118. Further alternatives are also possible.

Schottky Diode

Figures 3A, 3B, 3C, 3D:
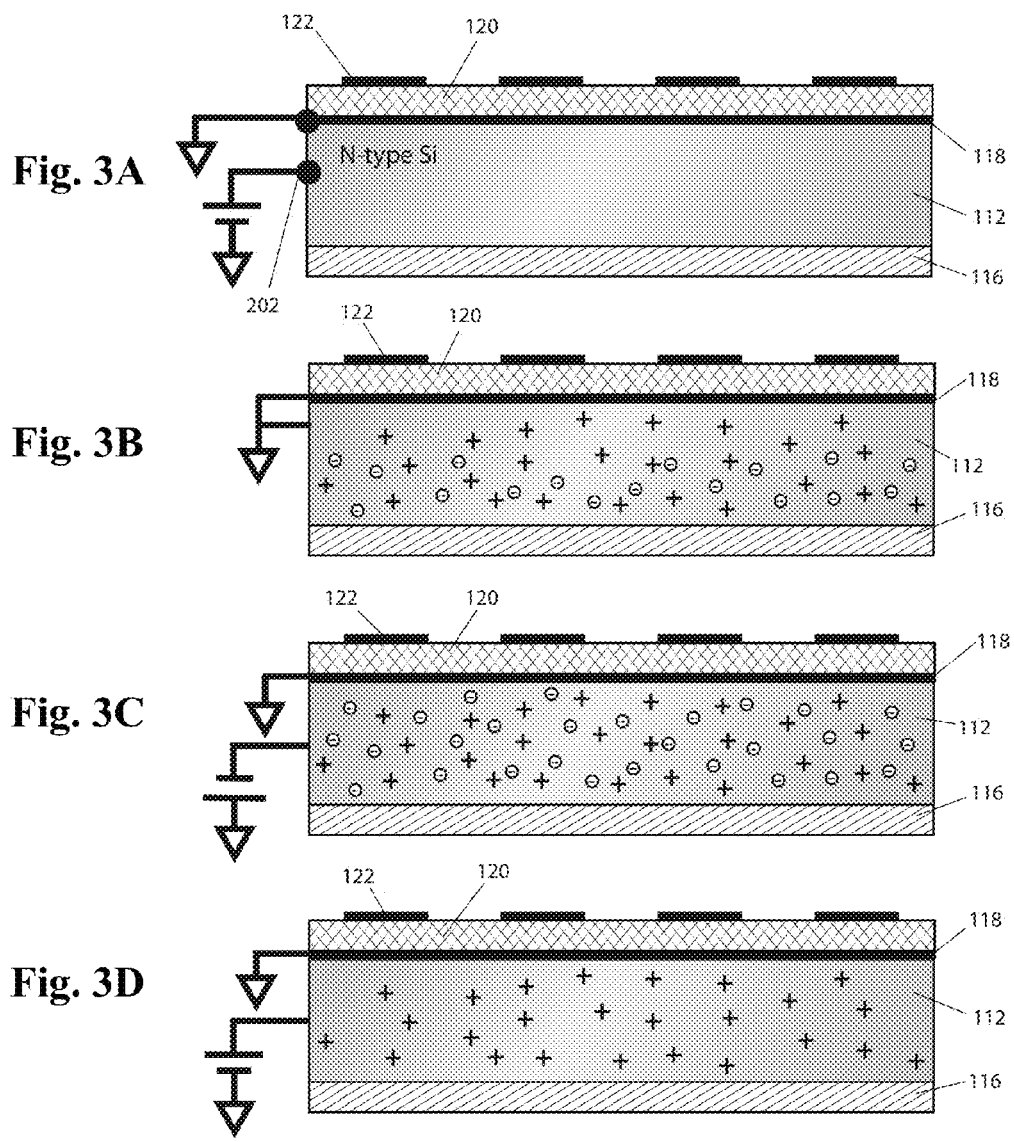
FIGS. 3A-3D illustrate a mechanical resonating structure having a conducting layer and a semiconductor layer configured as a diode to control charge carrier distribution in the semiconductor layer, according to a second non-limiting embodiment.

Mechanical resonating structures according to a second non-limiting embodiment differ from that of FIGS. 2A-2F in that the silicon oxide layer 114 is relocated or removed, as shown in FIGS. 3A-3D. Thus, in this non-limiting embodiment, the conducting layer 118 directly contacts the silicon layer 112. Alternatively, the silicon oxide layer 114 may remain and an additional electrode may be disposed between the silicon oxide layer 114 and the silicon layer 112. The direct physical contact between an electrode (e.g., conducting layer 118 configured as an electrode) and the silicon layer 112 forms a Schottky barrier. A DC voltage is applied between the silicon layer 112 and the conducting layer 118 using electrical contact 202 and the conducting layer 118 (see FIG. 3A). In FIG. 3B, when 0 V (zero Volts) is applied, there may be a depletion of electrons near the metal-silicon interface of conducting layer 118 and silicon layer 112 due to work function mismatch between the two materials.

In FIG. 3C, the diode is forward-biased as a negative voltage is applied to the silicon layer 112, which in this non-limiting embodiment is an n-type silicon layer). The work function barrier is lowered and electrons fill the formerly depleted region of the silicon layer 112. The silicon layer 112 now behaves mechanically as if it were uniformly n-type.

In FIG. 3D, a reverse-bias is applied (the silicon layer 112 is more positive in potential than the conducting layer 118). The silicon layer 112 is depleted of electrons and the mechanical behavior is affected accordingly. For example, the silicon layer 112 may become more stiff in such circumstances, though not all embodiments are limited in this respect.

pn Junction

A third embodiment of a mechanical resonating structure according to an aspect of the present application has a semiconductor layer (e.g., a silicon layer) that is doped to form at least two distinct doping regions and therefore at least one pn junction. The doping regions may be formed vertically within the semiconductor layer or laterally and in some embodiments may be thought of as source and drain regions as those terms are used in the context of metal-oxide-semiconductor field effect transistors (MOSFETs). A non-limiting example is illustrated in FIGS. 4A-4E.

FIGS. 4A-4E illustrate an example in which the silicon layer 112 is n-type, but its top and bottom surfaces are doped p-type, resulting in three regions of doping 402a-402c, with 402a and 402c being doped p-type and 402b being n-type. Thus, a first pn junction 406a is formed by regions 402a and 402b and a second pn junction 406b is formed by regions 402b and 402c. Each of the regions 402a-402c is contacted by a respective electrical contact (e.g., an electrode) 404a-404c. The embodiment of FIG. 4A may be particularly easy to implement with existing fabrication processes.

FIG. 4A shows the application of a DC voltage between the p- and n-type silicon regions. In FIG. 4B, the 0 V (zero Volts) DC condition is illustrated, showing the abundance of electrons in the n-type region 402b and holes in the p-type regions 402a and 402c.

In FIG. 4C, the pn junctions 406a and 406b are "forward-biased" (the p voltage is more positive than the n voltage) resulting in an effective growth of the n region into the p regions. N-type mechanical behavior in this regime contributes more to the overall stiffness matrix compared to the 0 V (zero Volt) condition since the n region is effectively larger than in the 0 V condition.

In FIG. 4D, the junctions 406a and 406b are reverse-biased resulting in growth of the p regions. In FIG. 4E, the reverse bias voltage of FIG. 4D is increased to the point that the p regions grow together, closing off the n region and resulting in uniformly p-type mechanical behavior.

While various non-limiting embodiments have been shown in which a bias voltage is applied to a layer of the mechanical resonating structure, it should be appreciated that any suitable manner of applying the bias voltage may be used. According to a non-limiting alternative, the bias voltage may be applied using one electrode of the mechanical resonating structure and a component not part of the mechanical resonating structure. For example, the substrate 102 may be a semiconductor substrate (e.g., silicon) and may be used to apply a bias voltage to a semiconductor layer of the micromechanical resonating structure 110, as shown in FIG. 10. Alternatively, an electrode may be disposed on the substrate 102 and that electrode may be used to apply a bias voltage, for example as shown in FIG. 11. A bias voltage may be applied using any suitable combination of techniques described herein. For example, a bias voltage may be applied to a semiconductor layer of a mechanical resonating structure using a substrate as an electrode (e.g., as in FIG. 10) in combination with conducting layer 118. A bias voltage may be applied to a semiconductor layer using an electrode disposed beneath the mechanical resonating structure (e.g., see FIG. 11) in combination with the conducting layer 118. Various alternatives are also possible, as these are non-limiting examples.

As mentioned previously, according to some aspects of the present application, a DC bias voltage is applied to a semiconductor material of a mechanical resonator. However, according to an alternative embodiment, a time varying voltage (e.g., an AC voltage) is applied to the semiconductor material. The voltage may vary over time in response to certain conditions (e.g., in response to a measured temperature change, the passage of a predetermined period of time, or any other suitable condition) or may vary periodically (e.g., a sinusoidal bias voltage). For example, a timing varying bias voltage may be applied to structures having any of the configurations shown and described herein (e.g., the structures of FIGS. 2A-2F, 3A-3D, 4A-4E, etc.). Thus, the various aspects described herein are not limited to application of any particular bias voltage unless otherwise stated.

The aspects described herein may be used for various reasons and may obtain various benefits. As explained previously, application of a voltage (and therefore an electric field) to a semiconductor material of a mechanical resonator may alter the mechanical properties of the semiconductor material. An example of a mechanical property that may be altered is the stiffness of the semiconductor material. Thus, application of a suitable bias voltage to the semiconductor material may stiffen or soften the semiconductor material. Accordingly, the stiffness of a semiconductor material of a mechanical resonating structure may be controlled to tune the frequency of operation of the mechanical resonator, to compensate for temperature induced changes in the frequency of operation of the mechanical resonating structure, or may be used for any other suitable reason.

The frequency of operation of a mechanical resonating structure may depend on the stiffness of materials used to form the mechanical resonating structure. Thus, as a non-limiting example, the frequency of operation, or the resonance frequency, of the micromechanical resonating structure 110 may depend on the stiffness of silicon layer 112. Accordingly, varying the stiffness of the silicon layer 112 may alter the frequency of operation, or the resonance frequency, of the resonating structure. According to one aspect, then, the frequency of operation of a mechanical resonating structure is controlled by controlling a charge distribution of the mechanical resonating structure.

The frequency behavior of a mechanical resonating structure may be temperature dependent, and the techniques described herein may be used to control the mechanical resonating structure to account for such temperature dependent behavior. The material properties of silicon, specifically its stiffness tensor, show a substantial temperature dependence, resulting in a temperature dependence of the resonance frequency of a mechanical resonating structure including silicon. As an example, micromechanical resonators fabricated purely out of silicon possess temperature coefficients of frequency (TCF) of typically −30 ppm/K. As a result, an oscillator may show a temperature drift of +1950 ppm at −40° C. and −1800 ppm at +85° C. By contrast, it may be desirable for a high-end oscillator to possess a temperature stability of ±2.5 ppm over the entire temperature range from −40° C. to +85° C. According to an aspect of the present application, a method is introduced that exploits the effects of free charge carriers on the stiffness tensor of silicon (or other semiconductor material) to reduce the −30 ppm/K TCF of silicon.

Figure 5:
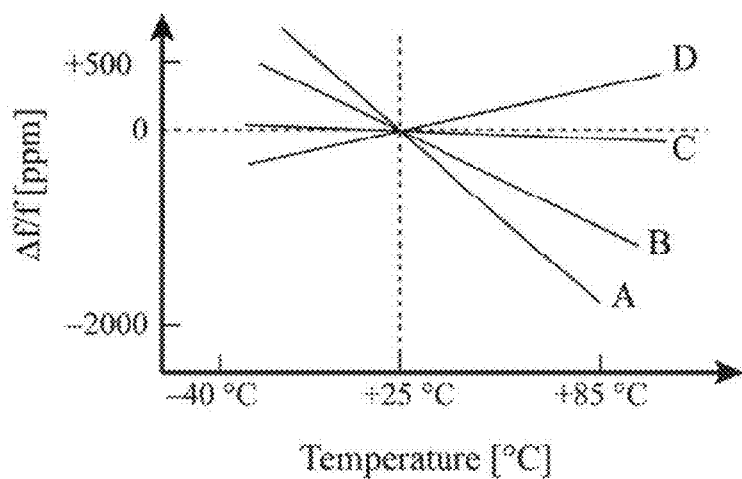
FIG. 5 shows a graph of the normalized frequency variation ($\Delta f/f$) versus temperature of the mechanical resonating structures in FIGS. 6A-6D as a function of temperature according to embodiments of the present application.

One manner in which to improve the temperature drift of silicon resonators is to add another layer of material on the silicon that, instead of softening with temperature, as is the case for silicon, hardens with temperature, as is the case for quartz and silicon dioxide. As disclosed in U.S. patent application Ser. No. 12/639,161 filed on Dec. 16, 2009, entitled MECHANICAL RESONATING STRUCTURES INCLUDING A TEMPERATURE COMPENSATION STRUCTURE, and published as U.S. Patent Application Publication No. US-2010-0182102-A1 on Jul. 22, 2010, and issued as U.S. Pat. No. 8,058,769, incorporated herein by reference in its entirety, a stack of two silicon oxide layers on the top and bottom of the silicon, respectively, can be implemented with a piezoelectric stack on either the top or bottom oxide (see, for example, FIGS. 1A and 1B). Other combinations of silicon and silicon oxide are also possible. The resulting TCF may be dramatically reduced, as illustrated in FIG. 5 for the various configurations in FIGS. 6A-6D, where line A in FIG. 5 corresponds to the structure of FIG. 6A, line B corresponds to the structure of FIG. 6B, line C corresponds to the structure of FIG. 6C, and line D corresponds to the structure of FIG. 6D. The mechanical resonating structure of FIG. 6A includes no temperature compensation stack. The mechanical resonating structures of FIGS. 6B-6D each include a temperature compensation stack formed of a silicon layer 112 sandwiched between silicon oxide layers 114 and 116, where the thickness of the oxide layers differ between the figures. The resulting temperature dependent change in frequency of each of the mechanical resonating structures of FIGS. 6A-6D is illustrated in FIG. 5 (as lines A-D, respectively). Yet, even with such temperature compensating stacks, a residual temperature drift which is typically on the order of −80 ppm to −150 ppm over the temperature range −40° C. to +85° C. may still remain.

Thus, control of the stiffness of the semiconductor layer of a mechanical resonating structure using the techniques described herein may be beneficial. For example, the temperature dependence of the mechanical resonating structure's frequency may be compensated by application of a suitable bias voltage, as described above. Thus, application of a bias voltage may allow for achieving frequency stability of ±2.5 ppm over the temperature range of the resonating structure (e.g., from −40° C. to +85° C.). Also, or alternatively, the beneficial frequency stability may be achieved without the need to include a temperature compensating oxide layer in the mechanical resonating structure (e.g., silicon oxide layer 114 and/or 116), which can simplify design and fabrication of the resonating structure.

Figure 7A:
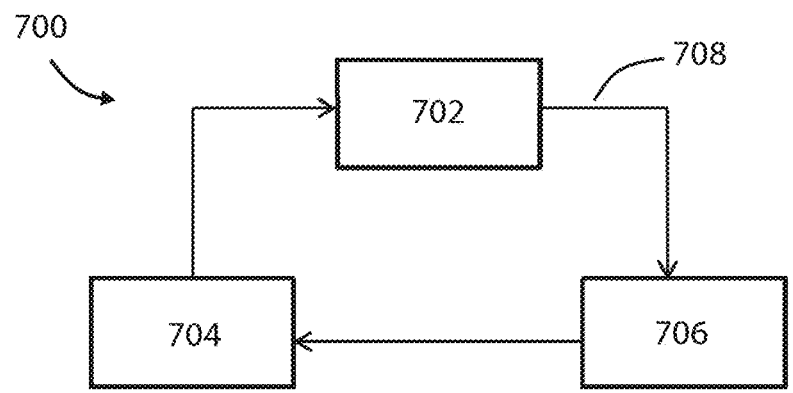
FIG. 7A is a block diagram of an oscillator including a mechanical resonator, a drive circuit, and a tuning circuit.

In some instances in which a mechanical resonating structure is used in an oscillator, the oscillator may include a tuning circuit to achieve the desired ±2.5 ppm stability over the temperature range. Examples of suitable tuning circuits are described in U.S. patent application Ser. No. 12/699,094 (the '094 application) filed on Feb. 3, 2010, entitled METHODS AND APPARATUS FOR TUNING DEVICES HAVING MECHANICAL RESONATORS, and published as U.S. Patent Application Publication No. US-2010-0308927-A1 on Dec. 9, 2010, which is incorporated herein by reference in its entirety. A non-limiting example is also illustrated in FIG. 7A, which shows an oscillator 700 including a mechanical resonator 702, a drive circuit 704, and a tuning circuit 706. The drive circuit and tuning circuit may be of the types described in the '094 application, or any other suitable type.

A brief description of a non-limiting example of the operation of the oscillator 700 is now provided. The drive circuit 704 may drive (or actuate) the mechanical resonator 702 by applying thereto a suitable electrical signal. The mechanical resonating structure 702 may be of the types described herein or any other suitable type. As a result of application of the electrical signal from the drive circuit (which signal may be referred to herein as a "drive signal), the mechanical resonating structure 702 may resonate. The mechanical resonating structure may output an output signal 708 to the tuning circuit 706. The tuning circuit may, in turn, generate a tuning signal of any suitable type, and provide the tuning signal to the drive circuit 704 which may adjust the drive signal accordingly. For instance, the tuning circuit may determine that the frequency of the output signal differs from a desired frequency, and may provide an appropriate tuning signal to the drive circuit 704 to adjust the frequency of the drive signal. The tuning circuit may, in some non-limiting embodiments, phase shift the output signal 708 in a manner described in the '094 application and provide the resulting phase-shifted signal to the drive circuit 704. Other manners of operation are also possible, as that described is a non-limiting example. According to a non-limiting embodiment, control of a semiconductor layer of the mechanical resonating structure 702 as described herein may also be performed as part of the operation of the oscillator 700.

Figure 7B:
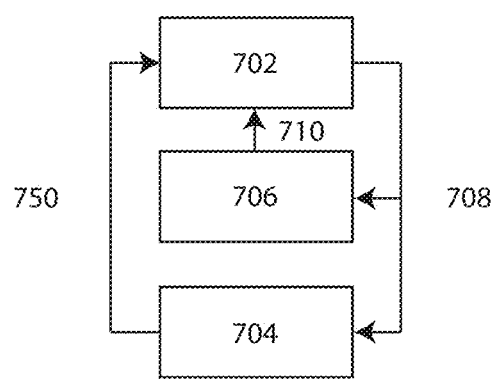
FIG. 7B illustrates an alternative oscillator configuration to that of FIG. 7A.

FIG. 7B illustrates an alternative oscillator configuration to that of FIG. 7A. As shown, the oscillator 750 differs from the oscillator 700 of FIG. 7A in that the mechanical resonating structure receives a drive signal from the drive circuit 704 in addition to a tuning signal 710 from the tuning circuit 706. Also, the output signal of the mechanical resonating structure 702 is provided to both the drive circuit 704 and the tuning circuit 706. Other configurations are also possible, as those of FIGS. 7A and 7B are non-limiting examples.

In the embodiment of FIG. 7B, the phase of the output signal is not shifted electrically. Rather, the stiffness of the mechanical resonating structure 702 may be adjusted with the tuning signal 710, thus altering the resonance frequency of the mechanical resonating structure. The signal 710 may be applied in any suitable manner, such as by applying it to 202 in FIG. 2A, or in any other suitable manner. The oscillator 750 may track the change in frequency of the mechanical resonating structure owing to the change in stiffness of the mechanical resonating structure 702.

Figure 8:
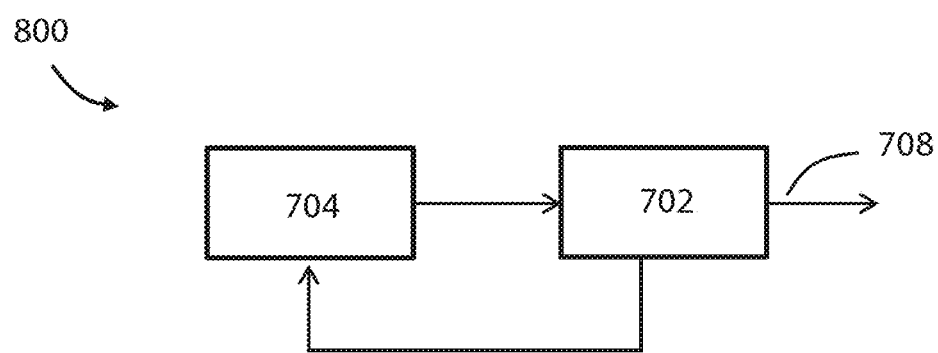
FIG. 8 is a block diagram of an oscillator including a mechanical resonator, a drive circuit, and no tuning circuit, according to an embodiment of the present application.

The aspects described herein may allow for removal of a tuning circuit from an oscillator or reduction of its role, which may save valuable power, test time and area on any integrated circuit coupled to the mechanical resonating structure. Moreover, reducing or eliminating the need to tune an oscillator using a tuning circuit allows for building an oscillator with higher Q, which can produce better phase noise, among other things. An example is illustrated in FIG. 8, which shows an oscillator 800 including the mechanical resonator 702 and drive circuit 704, but no tuning circuit. The charge carrier distribution within the mechanical resonator may be controlled according to any of the aspects described herein to enable accurate operation of the oscillator 800 without the need for any tuning circuit. The resonator may produce an output signal 708. The oscillator 800 may be a MEMS oscillator.

In addition to temperature compensation, for some applications it is important to achieve a high frequency accuracy of a mechanical resonating structure at room temperature of ±100 ppm or less. Manufacturing tolerances generally produce resonance frequencies spanning several percent from a single wafer or batch of wafers. By tuning out initial frequency offsets using one or more of the aspects described herein, variations from manufacturing can be electronically removed.

It should thus be appreciated that the charge carrier control described herein may be used individually as a mechanism to control operation of a mechanical resonating structure, or may be used in combination with one or more additional techniques (e.g., the use of a tuning circuit with the mechanical resonating structure, the use of a temperature compensation stack of the mechanical resonating structure, or other frequency control techniques) to control operation of the mechanical resonating structure.

The mechanical resonating structures described herein may be used as stand-alone components, or may be incorporated into various types of larger devices. Thus, the various structures and methods described herein are not limited to being used in any particular environment or device. However, examples of devices which may incorporate one or more of the structures and/or methods described herein include, but are not limited to, tunable meters, mass sensors, gyroscopes, accelerometers, switches, and electromagnetic fuel sensors. According to some embodiments, the mechanical resonating structures described are integrated in a timing oscillator. Timing oscillators are used in devices including digital clocks, radios, computers, oscilloscopes, signal generators, and cell phones, for example to provide precise clock signals to facilitate synchronization of other processes, such as receiving, processing, and/or transmitting signals. In some embodiments, one or more of the devices described herein may form part or all of a MEMS.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

In addition, while some references have been incorporated herein by reference, it should be appreciated that the present application controls to the extent the incorporated references are contrary to what is described herein.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A piezoelectric mechanical resonating structure, comprising:
    a first electrode;
    a second electrode;
    a piezoelectric material active layer between the first and second electrodes and configured to oscillate in response to application of an electric voltage thereto by the first and second electrodes;
    a semiconductor layer, wherein the second electrode is configured between the semiconductor layer and the piezoelectric material active layer, and wherein the semiconductor layer is a suspended layer coupled to a substrate by at least one anchor; and
    an electrical contact to the semiconductor layer and distinct from the second electrode, wherein the second electrode and the electrical contact to the semiconductor layer are configured to apply a bias voltage to the semiconductor layer.

2. The piezoelectric mechanical resonating structure of claim 1, wherein the second electrode is configured as a ground plane.

3. The piezoelectric mechanical resonating structure of claim 1, further comprising an oxide layer between the second electrode and the semiconductor layer.

4. The piezoelectric mechanical resonating structure of claim 3, wherein the second electrode, oxide layer, and semiconductor layer are configured as a capacitor.

5. The piezoelectric mechanical resonating structure of claim 1, wherein the second electrode directly contacts the semiconductor layer.

6. The piezoelectric mechanical resonating structure of claim 1, wherein the semiconductor layer is doped to have at least one pn junction therein.

7. The piezoelectric mechanical resonating structure of claim 1, wherein the electrical contact to the semiconductor layer is a direct electrical contact.

8. A mechanical resonating structure, comprising:
    an active layer configured to oscillate in response to actuation;
    a support layer comprising a semiconductor material and configured to support the active layer; and
    a plurality of electrodes configured to apply a bias voltage to the support layer to control a charge distribution of the support layer.

9. The mechanical resonating structure of claim 8, further comprising a temperature compensation structure configured to compensate temperature induced changes in stiffness of the active layer, wherein the support layer forms part of the temperature compensation structure.

10. The mechanical resonating structure of claim 8, wherein a first electrode of the plurality of electrodes is configured in combination with a second electrode of the plurality of electrodes to apply the bias voltage to the support layer, and wherein the first electrode and a third electrode are configured in combination to apply an actuation signal to the active layer.

11. The mechanical resonating structure of claim 8, wherein the support layer forms part of a capacitor.

12. The mechanical resonating structure of claim 8, wherein the support layer forms part of a diode.

13. The mechanical resonating structure of claim 8, wherein the support layer forms part of a transistor.

* * * * *